(12) United States Patent
Homma et al.

(10) Patent No.: US 6,569,752 B1
(45) Date of Patent: May 27, 2003

(54) SEMICONDUCTOR ELEMENT AND FABRICATING METHOD THEREOF

(75) Inventors: Soichi Homma, Yokohama (JP); Masahiro Miyata, Yokohama (JP); Hirokazu Ezawa, Tokyo (JP); Junichiro Yoshioka, Yokohama (JP); Hiroaki Inoue, Machida (JP); Tsuyoshi Tokuoka, Fujisawa (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/522,820

(22) Filed: Mar. 10, 2000

(30) Foreign Application Priority Data

Mar. 11, 1999 (JP) .......................................... 11-065419

(51) Int. Cl.[7] .............................................. H01L 21/44
(52) U.S. Cl. ....................... 438/597; 438/106; 438/610; 438/611; 438/612; 438/613; 438/614; 257/678
(58) Field of Search ................................ 438/597, 106, 438/25–26, 610–12, 614, 613; 257/678

(56) References Cited

U.S. PATENT DOCUMENTS

| | | | |
|---|---|---|---|
| 5,328,660 A | * 7/1994 | Gonya et al. | ............... 420/562 |
| 5,360,988 A | * 11/1994 | Uda et al. | .................... 257/529 |
| 5,489,803 A | 2/1996 | Kanbe et al. | |
| 5,527,628 A | 6/1996 | Anderson et al. | |
| 5,576,869 A | * 11/1996 | Yoshida | ........................ 359/88 |
| 5,773,888 A | 6/1998 | Hosomi et al. | |
| 5,885,891 A | * 3/1999 | Miyata et al. | ............... 438/612 |
| 6,076,726 A | * 6/2000 | Hoffmeyer et al. | .... 228/180.22 |
| 6,224,690 B1 | * 5/2001 | Andricacos et al. | ........ 148/400 |
| 6,229,220 B1 | * 5/2001 | Saitoh et al. | ............... 257/780 |

FOREIGN PATENT DOCUMENTS

| | | |
|---|---|---|
| EP | 0416847 A2 | 3/1991 |
| EP | 0787559 A1 | 8/1997 |
| JP | 3-204193 | 9/1991 |
| JP | 8-13185 | 1/1996 |
| JP | 8-41676 | 2/1996 |
| JP | 10-32208 | 2/1998 |

OTHER PUBLICATIONS

Shangguan et al., Nov. 1994, IEEE Trans. on Components & Manufacturing Technology Part B vol. 17 No. 4 pp. 603–611.*

S. Homma et al., "Evaluation of Barrier Metals of Sn–Ag Solder Bumps for Flip–Chip Interconnection," The Fourth VLSI Packaging Workshop of Japan (1998), pp. 79–80.

* cited by examiner

Primary Examiner—Matthew Smith
Assistant Examiner—Granvill D Lee, Jr.
(74) Attorney, Agent, or Firm—Finnegan, Henderson, Farabow, Garrett & Dunner, L.L.P.

(57) ABSTRACT

The present semiconductor element comprises a semiconductor substrate, a wiring pad formed thereon, a layer of barrier metal formed thereon, an intermetallic compound $Ag_3Sn$ formed thereon, and a protruded electrode consisting of low-melting metal formed thereon. In addition, a fabricating method of a semiconductor element comprises the steps of forming a wiring pad on a semiconductor substrate, forming a layer of barrier metal thereon, forming a metallic layer containing Ag thereon, forming a layer of low-melting metal containing Sn thereon, and melting the layer of low-melting metal containing Sn to form a protruded electrode and simultaneously to form an intermetallic compound $Ag_3Sn$ at an interface between the metallic layer containing Ag and the layer of low-melting metal containing Sn. Thus, with Pb-free solder, a semiconductor element of high reliability can be obtained.

46 Claims, 8 Drawing Sheets

SEMICONDUCTOR ELEMENT AND FABRICATING METHOD THEREOF

BACKGROUND OF THE INVENTION

1. Field of the Invention

The present invention relates to a semiconductor element provided with a layer of intermetallic compound and a fabricating method thereof.

2. Description of Related Art

In surface mount technology (SMT) of a semiconductor element, it is very important to implement soldering process with reliability. In the SMT, solder that has been largely used is eutectic alloy of tin (Sn) and lead (Pb) (Sn: Pb=63:37% by weight). In addition, so as to cope with finer pitches, ternary alloy of composition of Sn—Pb—Bi (8% by weight) has been used too.

The primary reason for employing alloys as solder material is that, not mentioning to a large strength and corrosion resistance, alloys have a lower melting temperature compared with those of component simple elements. The alloys can be roughly distinguished into three categories of solid solutions, eutectic compounds and intermetallic compounds.

The solders that are provided in JIS Z 3282 include, other than the aforementioned solders of compositions of Sn—Pb and Sn—Pb—Bi, solders of compositions of such as Bi—Sn, Sn—Pb—Ag, Sn—Ag, Sn—Sb, Pb—Ag and Pb—Ag—Sn.

Among these solders, lead based solders are gradually declining in use. That is, Pb has a plurality of radioisotopes. These isotopes are intermediate or final products of decay series of uranium (U) or thorium (Th), and accompany α-decay that emits He atoms. Accordingly, in the solders, α-rays inevitably appear. The α-rays, upon reaching a CMOS element for instance, cause soft error problems to occur. Further, Pb, upon flowing out into soil, might be eluted due to acid rain to have adverse affect on the environment. From these reasons, use of solders containing lead (Pb) is declining.

Instead of these Pb based solders, Sn based solders (Sn—Ag solder for instance) that do not contain Pb are considered promising.

A method for fabricating a semiconductor device in which semiconductor element is surface-mounted with Sn—Ag based solder will be explained with reference to FIGS. 19 to 23.

First, as shown in FIG. 19, after forming an aluminum electrode pad 22 on a semiconductor substrate 21 consisting of silicon, while leaving an opening at a center portion of the aluminum electrode pad 22, passivation is implemented to form a passivation film 23. Then, as shown in FIG. 20, films of titanium (Ti) 24, nickel (Ni) 25 and palladium (Pd) 26 are sequentially stacked in this order to form a barrier metal layer 27.

Then, as shown in FIG. 21, resist 28 is coated on the barrier metal layer 27 and a portion above the aluminum electrode pad 22 is opened. Thereafter, in the opening a layer of Sn—Ag solder 29 is formed.

Next, as shown in FIG. 22, the resist 28 is removed and the barrier metal layer 27 is etched. Thereafter, as shown in FIG. 23, the layer 29 of Sn—Ag solder is reflowed to form a protruded electrode (bump) 30. Then, the semiconductor substrate 21 is diced to form semiconductor chips. The semiconductor chip is mounted on a wiring board (a printed circuit board) by use of flip-chip mounting method to produce a semiconductor device.

However, in general, such solders as Sn—Ag based ones that are free from Pb contain much Sn compared with the Sn—Pb solder. Accordingly, when left in high temperature service circumstances, the barrier metal layer deteriorates sooner. That is, since Sn in the solder tends to intrude and diffuse into the barrier metal layer (Ni layer), the barrier metal layer tends to deteriorate to cause lowering of reliability of a solder joint between the semiconductor element (chip) and the wiring board. This is a problem.

Further, there is a method in which Cu or Ni as the barrier metal is plated thicker to solve the aforementioned problems. However, in this method, number of step increases to cause problems.

Thus, so far, with solders that do not contain lead (Pb), highly reliable solder joint has not been formed.

SUMMARY OF THE INVENTION

The present invention has been carried out to solve these problems. The object of the present invention is to provide a semiconductor element of high reliability and a fabricating method thereof, in which solders that do not contain Pb are used as joining means.

A first aspect of the present invention is a semiconductor element. The semiconductor element comprises a semiconductor substrate, a wiring pad formed on the semiconductor substrate, a layer of barrier metal formed on the wiring pad, an intermetallic compound $Ag_3Sn$ formed on the barrier metal layer, and a protruded electrode. The protruded electrode consists of a low-melting metal formed on the intermetallic compound $Ag_3Sn$.

In the first aspect, the intermetallic compound $Ag_3Sn$ is formed in a layer or segregated in particles.

Further, in the present first aspect, the layer of barrier metal is selected from single layers and laminate layers of titanium (Ti), chromium (Cr), copper (Cu), nickel (Ni), palladium (Pd), gold (Au), tungsten (W), titanium nitride (TiN), tantalum (Ta), niobium (Nb), tantalum nitride (TaN), mixtures thereof and compounds thereof. In particular, due to excellent adherence with the intermetallic compound $Ag_3Sn$, a laminate layer stacked titanium (Ti) film, nickel (Ni) film and palladium (Pd) film in this order is preferably used.

The low-melting metal is selected from tin (Sn), silver (Ag), bismuth (Bi), zinc (Zn), indium (In), antimony (Sb), copper (Cu) and germanium (Ge), mixtures thereof and compounds thereof. To be specific, binary mixtures (alloys) such as eutectic Sn—Ag or the like can be cited, and ternary alloys such as Sn—Ag—Bi or the like also can be used.

A second aspect of the present invention is a fabricating method of a semiconductor element. The present method comprises the steps of forming a wiring pad on a semiconductor substrate, of forming a barrier metal layer on the wiring pad, of forming a layer of intermetallic compound $Ag_3Sn$ on the barrier metal layer, and of forming a protruded electrode. The protruded electrode consists of low-melting metal formed on the layer of intermetallic compound $Ag_3Sn$.

In the present fabricating method of the semiconductor element, the layer of barrier metal is selected from single layers and laminate layers of titanium (Ti), chromium (Cr), copper (Cu), nickel (Ni), palladium (Pd), gold (Au), tungsten (W), titanium nitride (TiN), tantalum (Ta), niobium (Nb), tantalum nitride (TaN), mixtures thereof, and compounds thereof. In particular, due to excellent adherence with the intermetallic compound $Ag_3Sn$, a laminate layer stacked titanium (Ti) film, nickel (Ni) film, and palladium (Pd) film in this order is preferably used.

The low-melting metal is selected from tin (Sn), silver (Ag), bismuth (Bi), zinc (Zn), indium (In), antimony (Sb), copper (Cu) and germanium (Ge), mixtures thereof and compounds thereof. To be specific, binary mixtures (alloys) such as eutectic Sn—Ag or the like can be cited, and ternary alloys such as Sn—Ag—Bi or the like also can be used.

A third aspect of the present invention is a fabricating method of the semiconductor element, comprising the steps of forming a wiring pad on a semiconductor substrate, of forming a layer of barrier metal on the wiring pad, of forming a metallic layer containing silver (Ag) on the layer of barrier metal, of forming a layer of low-melting metal containing tin (Sn) on the metallic layer containing Ag and of melting the layer of low-melting metal containing Sn to form a protruded electrode, thereby forming an intermetallic compound $Ag_3Sn$ in the neighborhood of an interface of the metallic layer containing Ag and the layer of low-melting metal containing Sn.

In the third aspect, the intermetallic compound $Ag_3Sn$ is formed in a layer. That is, when solder containing Sn is used as low-melting metal, during the solder reflow procedures, a lower layer containing Ag is also melted. Accordingly, the layer of intermetallic compound $Ag_3Sn$ is formed in the layer containing Ag, that is, between the solder layer and the barrier metal layer.

In addition, in the third aspect of the present invention, the intermetallic compound $Ag_3Sn$ can be segregated in particles. By appropriately adjusting thickness of the layer containing Ag and reflow temperature, the intermetallic compound $Ag_3Sn$ can be formed in a layer or in particles.

In the third aspect, the layer of barrier metal is selected from single layers and laminate layers of titanium (Ti), chromium (Cr), copper (Cu), nickel (Ni), palladium (Pd), gold (Au), tungsten (W), titanium nitride (TiN), tantalum (Ta), niobium (Nb), tantalum nitride (TaN), mixtures thereof and compounds thereof. In particular, due to excellent adherence with the intermetallic compound $Ag_3Sn$, a laminate layer stacked titanium (Ti) film, nickel (Ni) film, and palladium (Pd) film in this order is preferably used.

Further, the low-melting metal containing Sn is selected from simple Sn and mixtures of Sn and one or more kinds of metals selected from silver (Ag), bismuth (Bi), zinc (zn), indium (In), antimony (Sb), copper (Cu) and germanium (Ge). To be specific, binary mixtures (alloys) such as eutectic Sn—Ag or the like can be cited, and ternary alloys such as Sn—Ag—Bi or the like also can be used.

The protruded electrode in the present invention is formed by implementing plating of the low-melting metal, or by printing paste containing the low-melting metal. When the plating method is used, Ag plating and Sn plating can be separately implemented. Both of the Ag plating and Sn plating, when a plating solution of alkyl-sulfonic acid (salt) is employed, in addition to affecting less adversely on the environment, is compatible to each other during plating, too. Further, in the present invention, the protruded electrode is formed on the semiconductor element side, but can be formed on the wiring board side that is connected to a semiconductor element.

In general, after melting and cooling the Sn—Ag solder to solidify, in investigating texture thereof due to electron diffraction analysis, precipitate of $Ag_3Sn$ is found to be inevitably contained divided finely and distributed in matrix. According to the third aspect of the present invention, between the barrier metal layer and the low-melting metal layer for instance Sn—Ag solder layer, an intermetallic compound $AggSn$ is formed in a layer, or segregated in particles. Accordingly, the barrier metal layer and the low-melting metal layer are compatible to each other and excellent adherence can be obtained therebetween.

According to the present invention, Sn contained in the low-melting metal is suppressed from diffusing into the barrier metal layer, resulting in an improvement of reliability. The intermetallic compound $Ag_3Sn$ being prevented from growing coarse in grain size thereof even after high temperature protracted tests and thermal cycle tests, does not deteriorate due to temperature. In addition, in particular, when Pd is used as the barrier metal, due to excellent adherence between Pd and intermetallic compound $Ag_3Sn$ and Ag, the Ag layer or the layer containing Ag is not peeled off. Further, since the layer of intermetallic compound $Ag_3Sn$ can be formed by use of sputtering method, a film thickness can be easily controlled. In addition to this, the Ag layer, being able to form by use of sputtering or plating, can be easily controlled in the thickness thereof.

The semiconductor element of the present invention is connected to a wiring board of an arbitrary shape through a protruded electrode (bump) consisting of low-melting metal and is sealed by resin or the like to form a semiconductor device (a package). The semiconductor device can be further connected to a motherboard.

DETAILED DESCRIPTION OF THE PREFERRED EMBODIMENTS

In the following, preferred embodiments of the present invention will be explained with reference to drawings.

Embodiment 1

Figure 1:
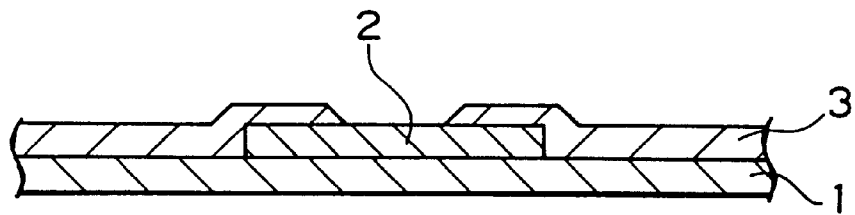
FIG. 1 is a cross section for showing schematically a step of forming an electrode pad and a passivation film on a semiconductor wafer in the first embodiment of the present invention.

As shown in FIG. 1, on an entire surface of a semiconductor wafer 1 (a diameter of 6 inches and a thickness of 625 μm) composed of silicon or the like, aluminum electrode pads 2 of 100 μm square are formed in lattice with a pitch of 350 μm. Thereafter, thereon, while leaving an opening at a center portion of the aluminum electrode pad 2, a passivation film 3 is formed.

Figure 2:
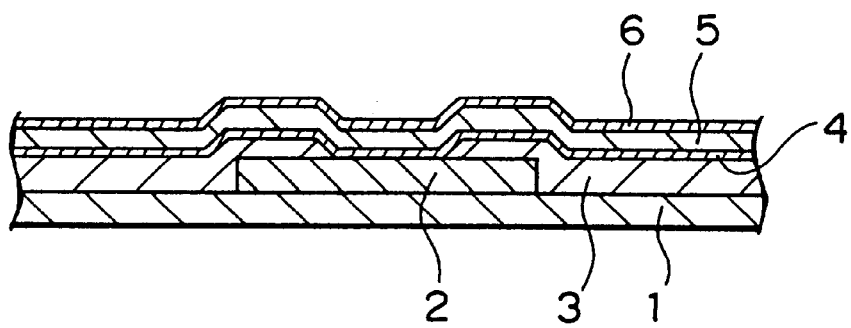
FIG. 2 is a cross section for showing schematically a step of forming a barrier metal layer in the first embodiment of the present invention.

Then, as shown in FIG. 2, on the entire surface of the semiconductor wafer 1, by use of sputtering or electron beam evaporation, a titanium film 4, a nickel film 5 and a palladium film 6 are sequentially stacked to form a barrier metal layer. As the barrier metal layer, each layer of chromium (Cr), copper (Cu), gold (Au), TiN, tungsten (W), tantalum (Ta), niobium (Nb) and tantalum nitride (TaN) may be combined to stack.

Figure 3:
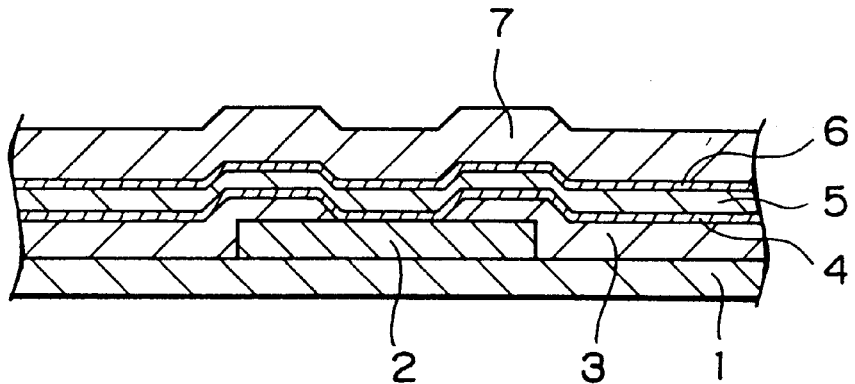
FIG. 3 is a cross section for showing schematically a step of forming a layer of an intermetallic compound $Ag_3Sn$ in the first embodiment of the present invention.

Next, as shown in FIG. 3, on the barrier metal layer, a layer 7 of an intermetallic compound Ag₃Sn is formed by use of sputtering or electron beam evaporation. The layer 7 of an intermetallic compound Ag₃Sn can be subsequently formed in the same chamber where the barrier metal layer has been formed. A thickness of the intermetallic compound Ag₃Sn layer 7 is 10 μm or less, being preferable to be in the range of 0.5 to 5 μm. When the thickness of the intermetallic compound Ag₃Sn layer 7 exceeds 10 μm, not only it takes a longer time to form the layer but a later step of etching becomes difficult. When the thickness is less than 0.5 μm, the layer does not sufficiently work as a barrier.

Figure 4:
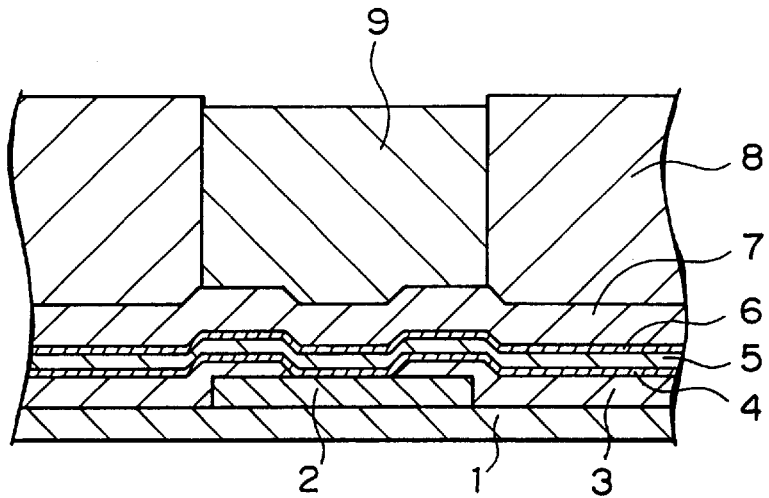
FIG. 4 is a cross section for showing schematically a step of forming a layer of low-melting metal at an opening of resist in the first embodiment of the present invention.

Then, as shown in FIG. 4, on the intermetallic compound Ag₃Sn layer 7, resist 8 is coated with a thickness of approximately 50 μm. Thereafter, a portion of the resist corresponding to above the aluminum electrode pad 2 is opened in a hole of a 100 μm square. In this opening, by plating, a layer 9 of low-melting metal is formed with a thickness of 50 μm.

As the low-melting metal, for instance eutectic Sn—Ag solder can be cited. In addition to this, one kind of metal selected from Sn, Ag, Bi, Zn, In, Sb, Cu, and Ge and mixtures or compounds of metals of two kinds or more selected therefrom can be used. In plating the low-melting metal as such, the semiconductor wafer thereon the resist 8 is formed, is immersed in a solution containing 40 g/litter of Sn, 0.4 g/litter of Ag, 100 g/litter of alkyl-sulfonic acid and additional agent consisting mainly of surfactant. In a bath of 20° C., with the barrier metal layer and the layer of an intermetallic compound Ag₃Sn as a cathode, and with a plate of Sn as an anode, under the condition of a current density of 1 A/dm², while gently stirring, the plating is carried out.

Figure 5:
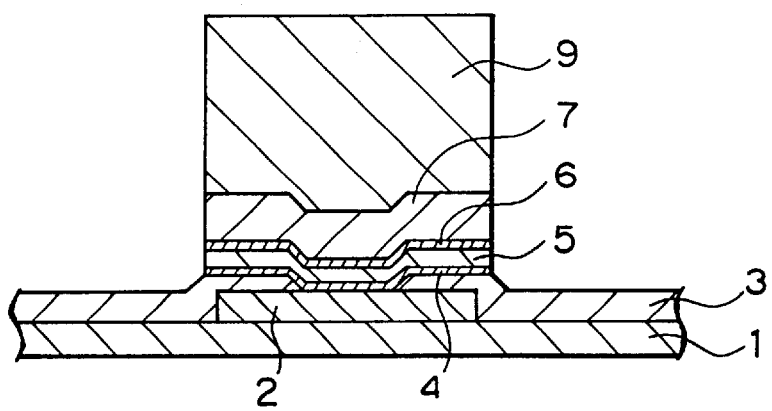
FIG. 5 is a cross section for showing schematically a step of removing resist to etch lower layers in the first embodiment of the present invention.

Next, as shown in FIG. 5, after the resist is removed (stripped) by use of acetone or known resist remover, the intermetallic compound Ag₃Sn layer 7, the palladium film 6 and the nickel film 5 that remained as a substrate electrode are etched by a solution of aqua regia. Further, the titanium film 4 is etched with a solution of ethylenediaminetetraacetic acid.

Figure 6:
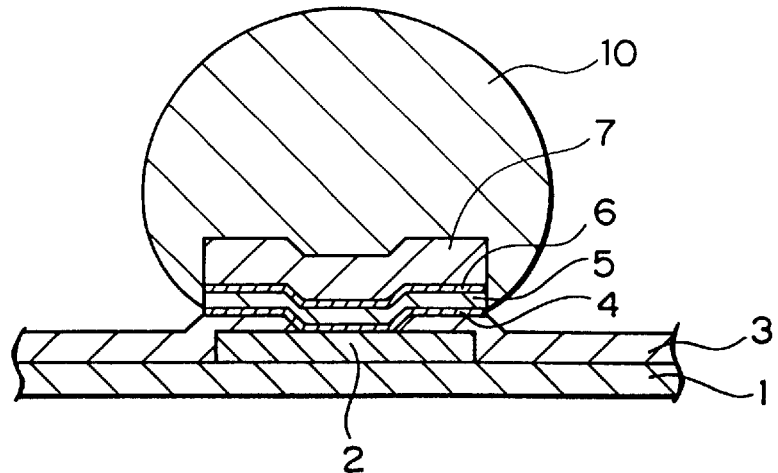
FIG. 6 is a cross section for showing schematically a step of forming a protruded electrode (bump) in the first embodiment of the present invention.
Figure 24:
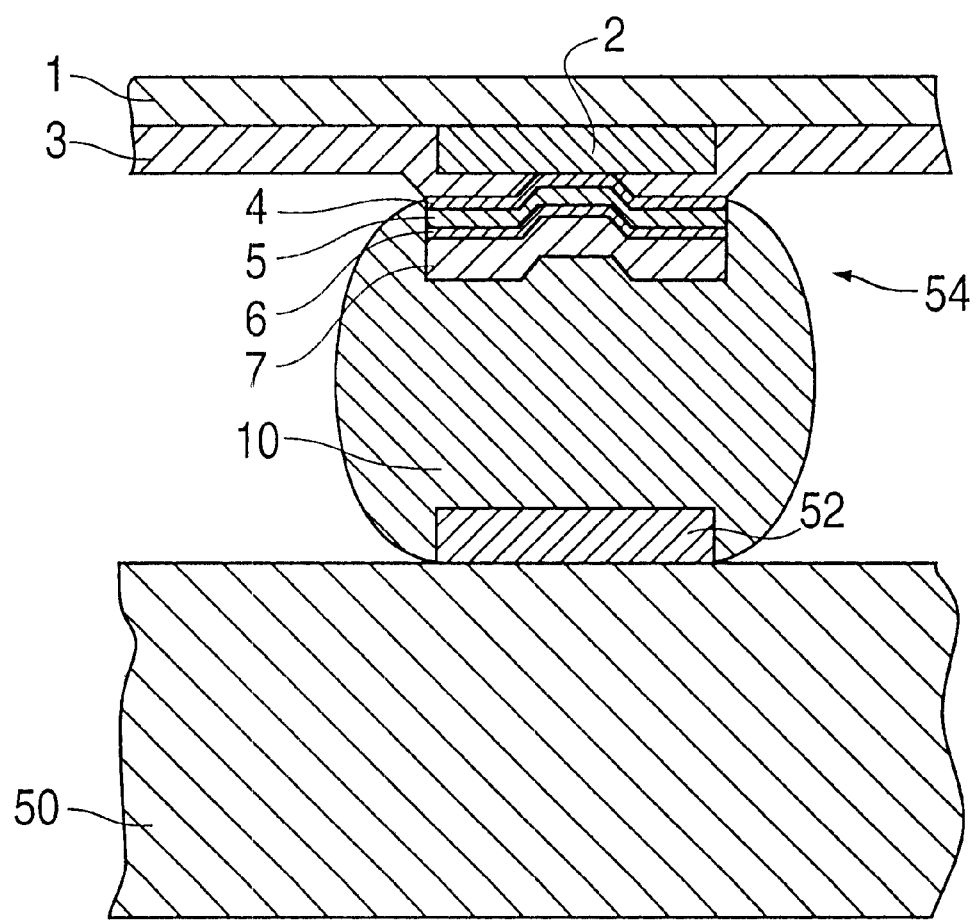
FIG. 24 is a cross sectional view of a semiconductor device comprising a semiconductor chip and a wiring board according to the present invention.

Then, the semiconductor wafer, after flux is coated thereon, is heated in an atmosphere of nitrogen, at a temperature of 250° C. for 30 sec. Thereby, as shown in FIG. 6, the low-melting metal undergoes solder reflow procedures to form a protruded electrode (bump) 10. Thereafter, though omitted in the figure, after electrical tests, the semiconductor wafer is diced to form semiconductor chips. The semiconductor chip is mounted by use of flip-chip connecting method as shown in FIG. 24. That is, the semiconductor chip, after mounting on a wiring board 50, goes through a nitrogen reflow furnace set at 250° C. to melt the bump consisting of low-melting metal. Here, as connecting pad 52 disposed on the wiring board 50, one kind of films of Cu, Ni, Au, Pd and laminate films thereof or films of mixtures thereof, or laminate films in which on a conductive metal one of the low-melting metals such as Sn, Ag, Bi, Zn, In, Sb, Cu and Ge and films of mixtures thereof is formed can be used.

Thus, the semiconductor chip and the wiring board are electrically connected to obtain a semiconductor device 54. Further, though not shown in FIG. 24, the semiconductor device 54 thus obtained is connected to a motherboard through connecting terminals disposed on the wiring board. In the surroundings of the semiconductor chip mounted on the wiring board, and between the wiring board and the semiconductor chip, sealing resins such as silicone resin, epoxy resin or acrylic resin can be filled to cure.

In the semiconductor element thus obtained in the first embodiment, between the barrier metal layer and the bump 10 consisting of low-melting metal, the layer 7 of an intermetallic compound $Ag_3Sn$ is formed. Accordingly, the barrier metal layer and the bump 10 are well adhered. Due to the layer 7 of the intermetallic compound $Ag_3Sn$, Sn contained in the low-melting metal can be prevented from intruding and diffusing into the barrier metal layer (Ni layer).

Accordingly, the barrier metal layer is prevented from deteriorating with the resulting improvement of reliability. The intermetallic compound $Ag_3Sn$ not growing coarser particles even after the high temperature protracted test or the thermal cycle test, does not tend to deteriorate due to the high temperatures. Furthermore, at the uppermost layer of the barrier metal layer, the palladium film 6 is disposed, resulting in excellent adherence with the layer of intermetallic compound $Ag_3Sn$. Furthermore, the layer of intermetallic compound $Ag_3Sn$ being able to form by use of sputtering or the like, can be regulated of thickness with ease.

Reliability of the semiconductor devices produced according to embodiment 1 is evaluated due to thermal cycle test. The results are shown in the following. For a test sample, a silicon chip of 10 mm square thereon 900 pieces of bump are formed is mounted on a glass-resin wiring substrate. The thermal cycle test is implemented with a cycle of −65° C.×30 min~25° C.×5 min~150° C.×30 min.

As the result of the thermal cycle test, even after 3000 cycles, there is found no snapping at all at solder joints. The bumps have sufficient connection strength, do not show any deterioration in the strength or do not peel off at all. Further, there occurred no short-circuiting between the bumps. When maintained the wafer at 150° C. after bump formation, even after 5000 hours, bump strength (bump share strength) of 50 g/piece is maintained and does not deteriorate.

Embodiment 2

In a second embodiment, on the barrier metal layer, instead of the layer of an intermetallic compound of $Ag_3Sn$, a layer of Ag is formed by use of sputtering or electron beam evaporation. As the low-melting metal for forming a protruded electrode, simple Sn, or metals consisting mainly of Sn and mixed with Ag, Bi, Zn, In, Sb, Cu or Ge can be used. Except for the above, similarly with embodiment 1, a semiconductor element and a semiconductor device are produced.

In the present embodiment, in the reflow procedure of the low-melting metal, Ag reacts with Sn in the low-melting metal to form an intermetallic compound $Ag_3Sn$, in a layer of a thickness of 0.5 μm to 5 μm at a boundary of the barrier metal layer and the low-melting metal layer. In order to obtain a layer of the intermetallic compound $Ag_3Sn$, a thickness of the Ag layer, though depending on temperatures, is preferable to be 4 μm or more.

Thus, in the second embodiment, between the barrier metal layer and the protruded electrode (bump) consisting of low-melting metal the layer of an intermetallic compound, $Ag_3Sn$ is formed. Accordingly, the barrier metal layer and the bump are well adhered. Due to the layer of the intermetallic compound $Ag_3Sn$, Sn contained in the low-melting metal is prevented from intruding and diffusing into the barrier metal layer (Ni layer), resulting in preventing deterioration of the barrier metal from occurring and in an improvement of reliability. Even after the high temperature protracted test and thermal cycle test, the intermetallic compound $Ag_3Sn$ does not grow coarser in particle size, with the resulting likelihood of less deterioration due to the temperatures.

Further, in the present embodiment, with simple Sn as a low-melting metal, a layer of Sn is formed on the layer of Ag. Thereafter, by use of reflow procedures to the layer of Sn, a layer of the intermetallic compound $Ag_3Sn$ is formed. Thereby, problems in implementing Sn—Ag solder plating can be solved.

That is, there are problems such that due to a large difference of deposition potentials between Sn and Ag, simultaneous deposition is difficult, abnormal growth occurs during plating, voids occur due to an additional agent, or depending on wettability of the plating solution the resist opening is plated with difficulty. Further, in general, in Sn—Ag solder, due to too much content of Sn, when left in service circumstances of high temperatures, the barrier metal layer deteriorates sooner. Further, in Sn—Ag eutectic solder, due to too small content of Ag of 3.5%, in plating, composition can be regulated with difficulty. However, by adopting a method in which after forming a layer of Sn on a layer of Ag, the Sn layer undergoes solder reflow procedures to form a layer of an intermetallic compound $Ag_3Sn$, all the aforementioned problems in plating with Sn—Ag solder can be solved.

Embodiment 3

In a third embodiment, on the barrier metal layer, instead of the intermetallic compound $Ag_3Sn$, a layer of Ag is plated on an entire surface of the wafer with a plating solution of alkyl-sulfonic acid (salt). As the low-melting metal for forming a protruded electrode, simple Sn, or metals consisting mainly of Sn and mixed with Ag, Bi, Zn, In, Sb, Cu or Ge can be used. Except for the above, similarly with embodiment 1, a semiconductor element and a semiconductor device are manufactured.

In the present embodiment, in the reflow procedure of the low-melting metal, Ag reacts with Sn in the low-melting metal to form an intermetallic compound $Ag_3Sn$ in a layer of a thickness of 0.5 μm to 5 μm between the barrier metal layer and the low-melting metal layer. In order to form the intermetallic compound $Ag_3Sn$ in a layer, the thickness of the Ag layer, though depending on temperatures, is preferable to be 4 μm or more.

Thus, in the third embodiment, between the barrier metal layer and the bump consisting of the low-melting metal the layer of an intermetallic compound $Ag_3Sn$ is formed. Accordingly, the barrier metal layer and the bump are well adhered. Due to the layer of an intermetallic compound $Ag_3Sn$, Sn contained in the low-melting metal is prevented from diffusing into the barrier metal layer (Ni layer), resulting in prevention of deterioration of the barrier metal from occurring and in an improvement of reliability. The intermetallic compound $Ag_3Sn$ even after the high temperature protracted test and thermal cycle test, does not grow coarser in particle size with the resulting likelihood of less deterioration due to the temperatures.

Further, in the present embodiment, with simple Sn as the low-melting metal, the layer of Sn is formed on the layer of Ag. Thereafter, by use of reflow procedure to the layer of Sn, a layer of an intermetallic compound $Ag_3Sn$ is formed. Thereby, difficulties in implementing Sn—Ag solder plating can be solved.

Both the Ag layer and the low-melting metal (Sn) layer, being formed with a plating solution of alkyl sulfonic acid, affect less adversely on the surroundings and is compatible with each other in plating. Further, since the Ag plating precedes the Sn plating, the Ag deposits uniformly to result in easy regulation. A thickness of plated layer can be readily regulated with a simple means of varying a plating time.

Embodiment 4

Figure 7:
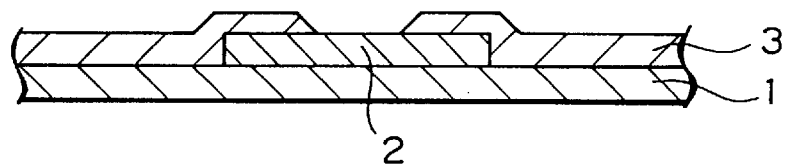
FIG. 7 is a cross section for showing schematically a step of forming an electrode pad and a passivation film on a semiconductor wafer in the fourth embodiment of the present invention.

As shown in FIG. 7, on an entire surface of a semiconductor wafer 1 (a diameter of 6 inches and a thickness of 625 μm) composed of silicon or the like, aluminum electrode pads 2 of 100 μm square are formed in lattice with a pitch of 350 μm. Thereafter, thereon, while leaving an opening at a center portion of the aluminum electrode pad 2, a passivation film 3 is formed.

Figure 8:
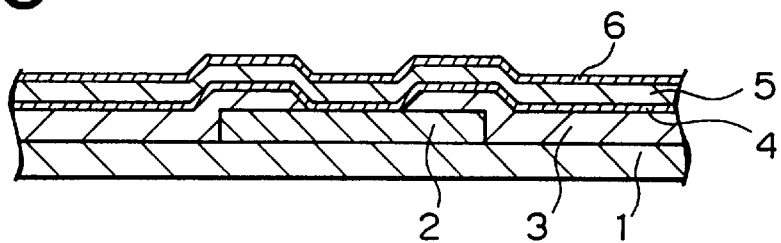
FIG. 8 is a cross section for showing schematically a step of forming a barrier metal layer in the fourth embodiment of the present invention.

Then, as shown in FIG. 8, on the entire surface of the semiconductor wafer 1, by use of sputtering or electron beam evaporation, a titanium film 4, a nickel film 5 and a palladium film 6 are sequentially stacked to form a barrier metal layer. As the barrier metal layer, each layer of chromium (Cr), copper (Cu), gold (Au), TiN, tungsten (W), tantalum (Ta), niobium (Nb) and tantalum nitride (TaN) may be combined to stack.

Figure 9:
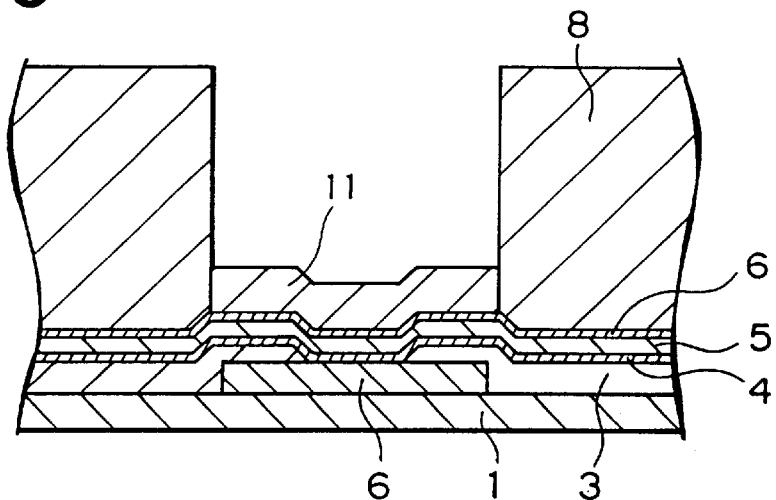
FIG. 9 is a cross section for showing schematically a step of forming a layer of Ag at an opening of resist in the fourth embodiment of the present invention.

Then, as shown in FIG. 9, on the barrier metal layer, resist is coated with a thickness of approximately 50 μm. Thereafter, a portion above the aluminum electrode pad 2 is opened in a hole of 100 μm square. In the opening, a layer 11 of Ag is plated with a plating solution of alkyl sulfonic acid. A thickness of the Ag layer 11 is 10 μm or less, being preferable to be in the range of 0.5 to 5 μm. When the thickness of the Ag layer 11 exceeds 10 μm, it takes a long time to form, and in the case of the thickness being less than 0.5 μm, a barrier effect can not be fully exhibited. In order to form the intermetallic compound $Ag_3Sn$ in a layer, though depending on temperatures, the thickness of the Ag layer 11 is preferable to be 4 μm or more.

Figure 10:
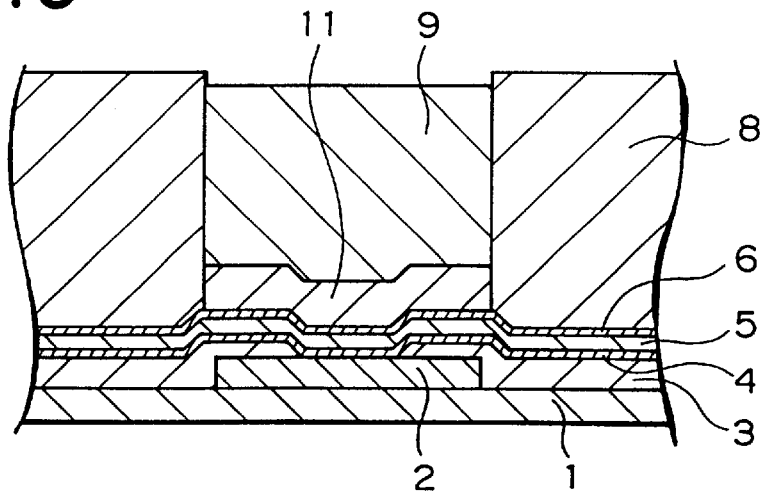
FIG. 10 is a cross section for showing schematically a step of forming a layer of low-melting metal on a layer of Ag in the fourth embodiment of the present invention.

Then, as shown in FIG. 10, on the Ag layer 11 formed in the opening, a layer 9 of low-melting metal is formed with a thickness of 50 μm.

As the low-melting metal, for instance eutectic Sn—Ag solder can be cited. In plating the low-melting metal as such, the semiconductor wafer thereon the resist 8 is formed, is immersed in a solution containing 40 g/litter of Sn, 0.4 g/litter of Ag, 100 g/litter of alkyl-sulfonic acid and additional agent consisting mainly of surfactant. In a bath held at 20° C., with the barrier metal layer and the Ag layer 11 as a cathode, and with a plate of Sn as an anode, under a current density condition of 1 $A/dm^2$, while gently stirring, the plating is carried out. As the low-melting metals, simple Sn, or metals consisting mainly of Sn and mixed with Ag, Bi, Zn, In, Sb, Cu, or Ge can be used.

Figure 11:
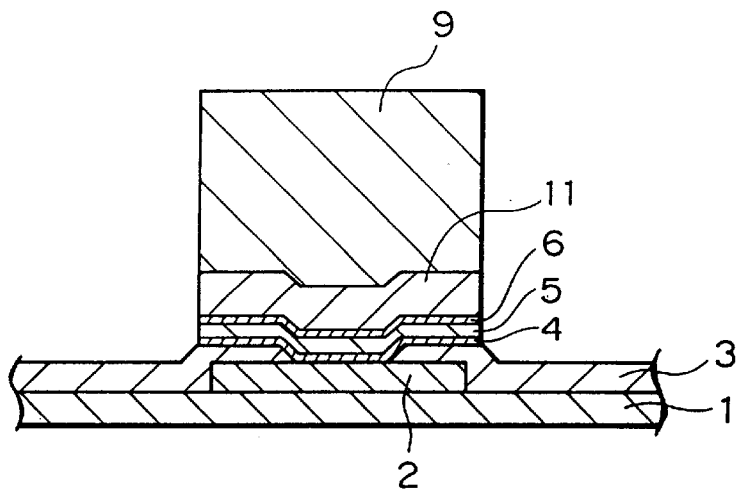
FIG. 11 is a cross section for showing schematically a step of removing resist to etch lower layers in the fourth embodiment of the present invention.

Next, as shown in FIG. 11, after the resist 8 is removed by use of acetone and known resist remover, the palladium film 6 and the nickel film 5 that remained as the substrate electrode are etched by a solution of aqua regia. Further, the titanium film 4 is etched with a solution of ethylenediaminetetraacetic acid. In the present embodiment, since the Ag layer 11 is formed in the opening of the resist 8, there is no need of etching the Ag layer 11 to remove.

Figure 12:
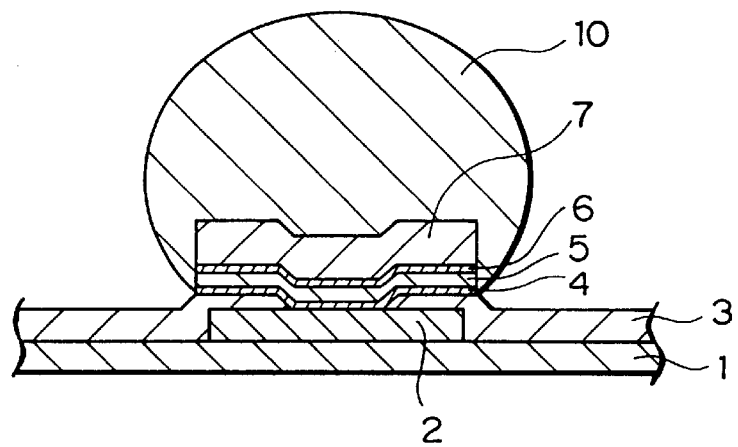
FIG. 12 is a cross section for showing schematically a step of forming a bump in the fourth embodiment of the present invention.

Next, as shown in FIG. 12, the semiconductor wafer, after coating flux thereon, is heated in an atmosphere of nitrogen at 250° C. for 30 sec to apply solder reflow procedures to form a protruded electrode (bump) 10. In the reflow procedures of the low-melting metal, Ag reacts with Sn in the low-melting metal to form a layer of an intermetallic compound $Ag_3Sn$, of a thickness of 0.5 μm to 5 μm between the barrier metal layer and the low-melting metal layer.

Thereafter, though not shown in the figure, standard electrical tests are carried out. Then, the semiconductor wafer is diced into semiconductor chips, followed by flip-chip mounting. In the step of flip-chip mounting, a semiconductor chip is mounted on a wiring board and is let go through a nitrogen reflow furnace to melt the bump consisting of the low-melting metal. Here, as the connecting pad formed on the wiring board, one kind selected from Cu, Ni, Au, and Pd films and laminated films thereof or films of mixtures thereof, or laminated films in which one of films of low-melting metals such as Sn, Pb, Ag, Bi, Zn, In, Sb, Cu and Ge, and mixtures thereof is formed on a conductive metal can be used.

Thus, the semiconductor chip and the wiring board are connected to form a semiconductor device. Further, thus obtained semiconductor device is connected to a motherboard through connecting terminals disposed on the wiring board. In the surroundings of the semiconductor chip that is mounted on the wiring board, and between the wiring board and the semiconductor chip, sealing resins such as silicone resin, epoxy resin or acrylic resin may be filled to cure.

In the fourth embodiment as such, between the barrier metal layer and the bump 10 consisting of the low-melting metal, the layer 7 of an intermetallic compound $Ag_3Sn$ is formed. As a result of this, the barrier metal layer and the bump 10 are well adhered. The layer 7 of the intermetallic compound $Ag_3Sn$ suppresses Sn contained in the low-melting metal diffusing into the barrier metal layer (Ni layer). Accordingly, the barrier metal layer is prevented from deteriorating, resulting in an improvement of reliability. The intermetallic compound $Ag_3Sn$, not growing coarse even after the high temperature protracted test and thermal cycle test, does not deteriorate due to the temperatures. Furthermore, since the Pd film 6 that well adheres with Ag is disposed at the uppermost layer of the barrier metal layer, the Ag layer 11 or the layer 7 of the intermetallic compound $Ag_3Sn$ does not peel off.

Further, in the present embodiment, with simple Sn as a low-melting metal, a layer of Sn is formed on the layer of Ag. Thereafter, by solder reflow procedures to the layer of Sn, a layer of the intermetallic compound $Ag_3Sn$ is formed. Thereby, problems in implementing Sn—Ag solder plating can be solved.

That is, there are problems such that due to a large difference of deposition potentials between Sn and Ag simultaneous deposition is difficult, abnormal growth occurs during plating, voids occur due to additional agent, or depending on wettability of the plating solution the resist opening is plated with difficulty. Further, in general, in Sn—Ag solder, due to too much content of Sn, when left in service circumstances of high temperatures, the barrier metal layer deteriorates sooner. Further, in Sn—Ag eutectic solder, due to too small content of Ag of 3.5%, in plating, composition can be regulated with difficulty. However, by adopting a method in which after forming a layer of Sn on a layer of Ag, the Sn layer undergoes reflow procedures to form a layer of an intermetallic compound $Ag_3Sn$, all the aforementioned problems in plating with Sn—Ag solders can be solved.

Both the Ag layer and the low-melting metal (Sn) layer, being formed with a plating solution of alkyl-sulfonic acid, affect less adversely on the surroundings and is compatible with each other in plating. Further, since the Ag plating precedes the Sn plating, the Ag deposits uniformly to result in easy regulation. A thickness of plated layer can be regulated with ease with a simple means such as varying a plating time.

Embodiment 5

In a fifth embodiment, the thickness of the Ag layer 11 is set at 1 μm. Except for this, a semiconductor element is manufactured similarly with embodiment 4.

Figure 13:
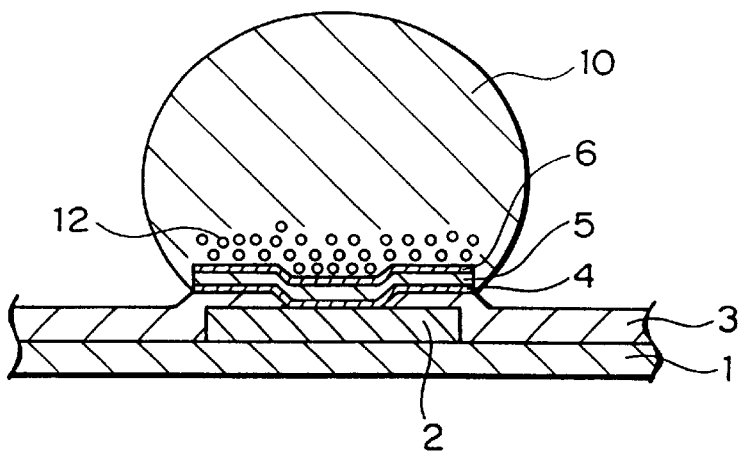
FIG. 13 is a cross section for showing schematically a step of forming, through formation of a bump, particles of an intermetallic compound Ag₃Sn segregated in the fifth embodiment of the present invention.

In the present embodiment, as shown in FIG. 13, Ag reacts with Sn in the low-melting metal to form, in the neighborhood of an interface of the Ag layer 11 and the low-melting metal layer, particles 12 of the intermetallic compound $Ag_3Sn$ segregated. To form the generated intermetallic compound $Ag_3Sn$ in particles, though depending on temperatures, the Ag layer 11 is preferable to be formed in a thickness of 4 μm or less.

In the present embodiment, in the neighborhood of the interface of the Ag layer 11 and the bump 10 consisting of the low-melting metal the particles 12 of the intermetallic compound $Ag_3Sn$ are formed segregated. Accordingly, the barrier metal and the bump 10 are adhered well. The particles 12 of the intermetallic compound $Ag_3Sn$ suppress Sn contained in the low-melting metal diffusing into the barrier metal layer (Ni). As a result of this, the barrier metal layer can be prevented from deteriorating, resulting in an improvement of reliability.

Embodiment 6

Figure 14:
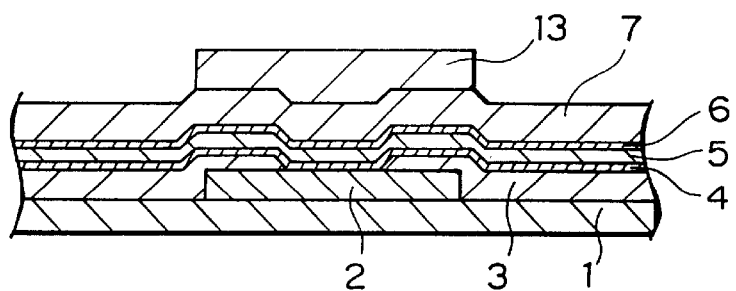
FIG. 14 is a cross section for showing schematically a step of sequentially forming an electrode pad, a passivation film and a barrier metal layer on a semiconductor wafer, and of thereon further forming a layer of an intermetallic compound Ag₃Sn, and a resist pattern in the sixth embodiment of the present invention.

As shown in FIG. 14, on an entire surface of a semiconductor wafer 1 (a diameter of 6 inches and a thickness of 625 $\mu$m) composed of silicon or the like, aluminum electrode pads 2 of 100 $\mu$m square are formed in lattice with a pitch of 350 $\mu$m. Thereafter, thereon, while leaving an opening at a center portion of the aluminum electrode pad 2, a passivation film 3 is formed.

Then, on the entire surface of the semiconductor wafer 1, by use of sputtering or electron beam evaporation, a titanium film 4, a nickel film 5 and a palladium film 6 are sequentially stacked to form a barrier metal layer. As the barrier metal layer, each layer of chromium (Cr), copper (Cu), gold (Au), TiN, tungsten (W), tantalum (Ta), niobium (Nb) and tantalum nitride (TaN) may be combined to stack.

Next, on the barrier metal layer, the layer 7 of the intermetallic compound $Ag_3Sn$ is formed by sputtering or electron beam evaporation. The layer 7 of the intermetallic compound $Ag_3Sn$ can be subsequently formed in the same chamber where the barrier metal layer has been formed. A thickness of the layer 7 of the intermetallic compound $Ag_3Sn$ is 10 $\mu$m or less, being preferable to be in the range of 0.5 to 5 $\mu$m. When the thickness of the layer 7 of the intermetallic compound $Ag_3Sn$ exceeds 10 $\mu$m, not only it takes a longer time to form the layer but also a later step of etching becomes difficult. When the thickness is less than 0.5 $\mu$m, the layer does not sufficiently work as a barrier. Next, on the layer 7 of the intermetallic compound $Ag_3Sn$, the resist is coated in a thickness of approximately 50 $\mu$m. Thereafter, so as to form a shape overlapping the portion of the aluminum electrode pad 2, a resist pattern 13 is formed with a glass mask or the like.

Figure 15:
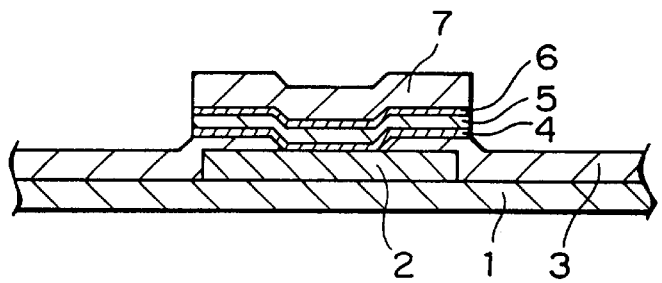
FIG. 15 is a cross section for showing schematically a step of etching lower layers, and of further removing a resist pattern in the sixth embodiment of the present invention.

Then, as shown in FIG. 15, with a solution of aqua regia, the layer 7 of the intermetallic compound $Ag_3Sn$, the palladium film 6 and the nickel 5 are etched. Thereafter, the titanium film 4 is etched with a solution of ethylenediaminetetraacetic acid. Further, with acetone or known resist stripping solution, the resist pattern 13 is removed (stripped).

Figure 16:
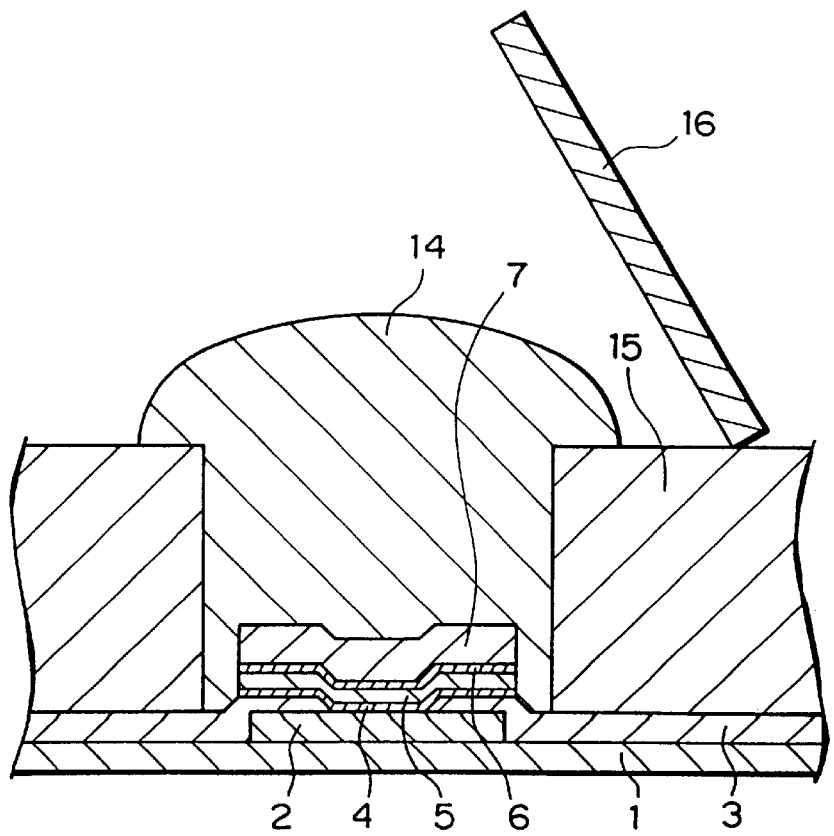
FIG. 16 is a cross section for showing schematically a step of screen-printing paste of low-melting metal in the sixth embodiment of the present invention.
Figure 17:
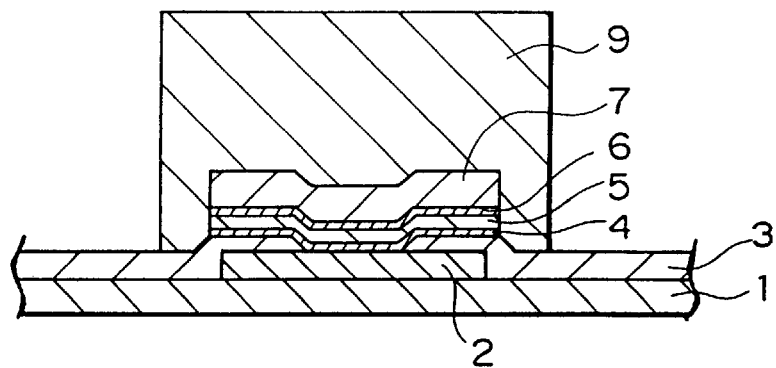
FIG. 17 is a cross section for showing schematically a step of removing a printing mask to form a layer of low-melting metal in the sixth embodiment of the present invention.

Then, as shown in FIG. 16, paste 14 of the low-melting metal is coated by screen-printing method. That is, a print mask 15 of a thickness of 60 $\mu$m and a 160 $\mu$m square is aligned on the wafer, the paste 14 containing low-melting metal is poured into the opening of the print mask 15, and the excess of the paste 14 is squeezed off by use of a squeegee. Thereafter, as shown in FIG. 17, the print mask 15 is pulled up or the wafer is pulled down, thereby the layer 9 of low-melting metal is formed on the layer 7 of the intermetallic compound $Ag_3Sn$. As the low-melting metal, eutectic Sn—Ag solder can be cited. One kind of metal selected from Sn, Ag, Bi, Zn, In, Sb, Cu and Ge or mixtures or compounds of two kinds or more of metals thereof can be used.

Figure 18:
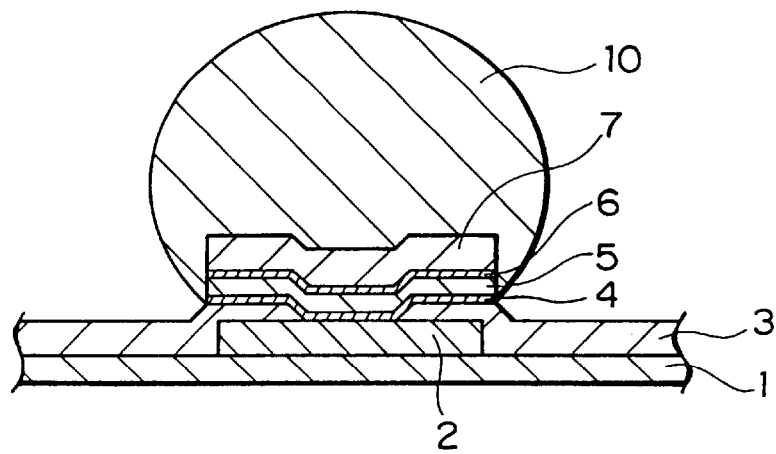
FIG. 18 is a cross section for showing schematically a step of forming a bump in the sixth embodiment of the present invention.
Figure 19:
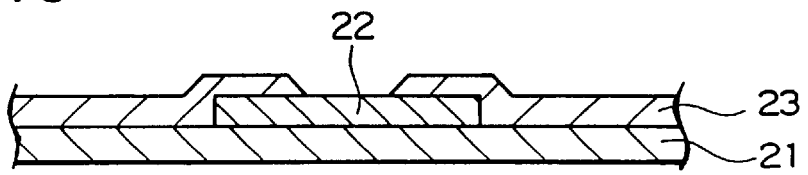
FIG. 19 is a cross section for showing schematically a step of forming an electrode pad and a passivation film on a semiconductor wafer in an existing fabricating method of a semiconductor element.
Figure 20:
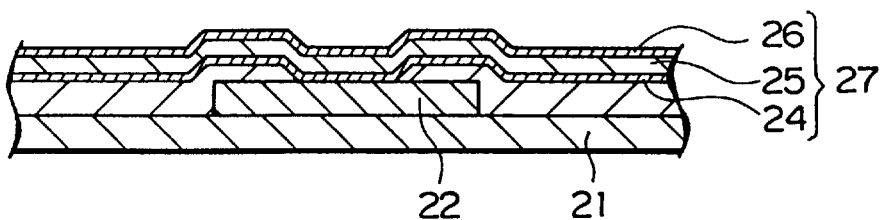
FIG. 20 is a cross section for showing schematically a step of forming a barrier metal layer in an existing fabricating method of a semiconductor element.
Figure 21:
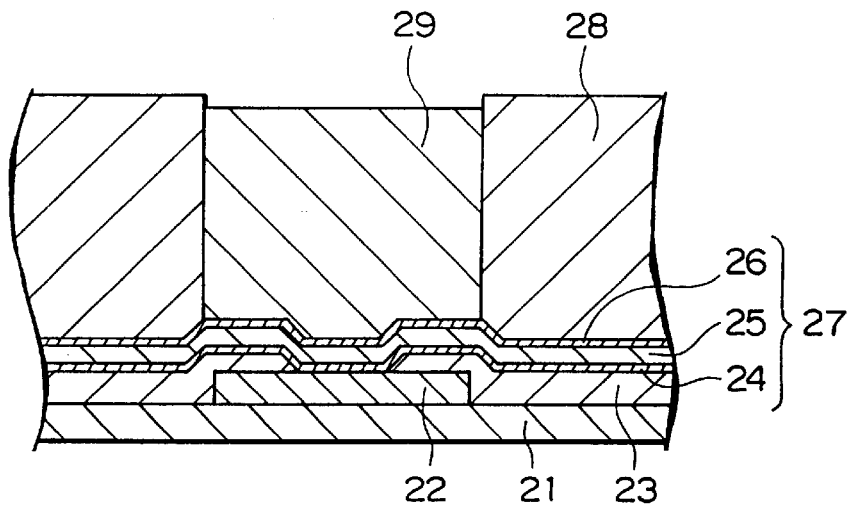
FIG. 21 is a cross section for showing schematically a step of forming a layer of low-melting metal at an opening of resist in an existing fabricating method of a semiconductor element.
Figure 22:
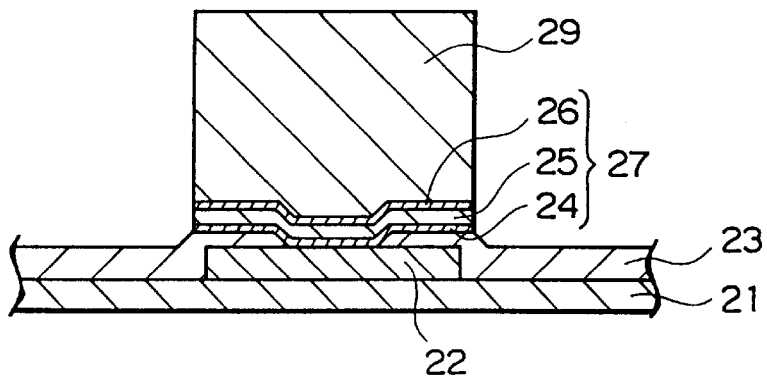
FIG. 22 is a cross section for showing schematically a step of removing resist and etching lower layers in an existing fabricating method of a semiconductor element.
Figure 23:
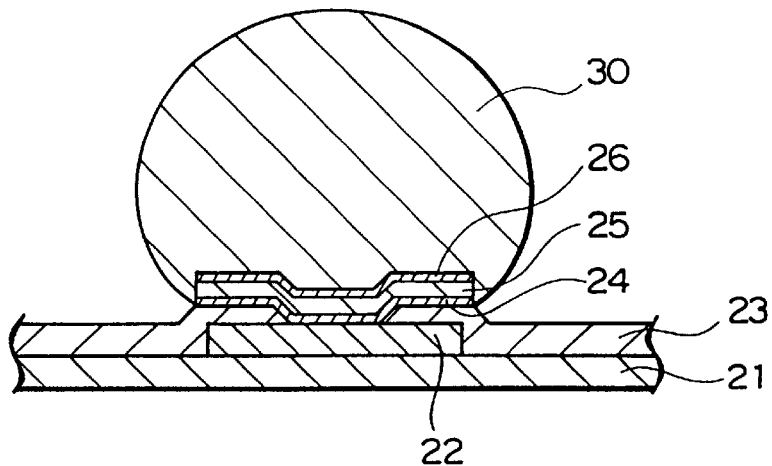
FIG. 23 is a cross section for showing schematically a step of forming a bump in an existing fabricating method of a semiconductor element.

Then, the semiconductor wafer is heated at 250° C. for 30 sec in an atmosphere of nitrogen to form, as shown in FIG. 18, a protruded electrode (bump) 10 by solder reflow procedure of the low-melting metal. Thereafter, not showing in the figure, after standard electrical tests, the semiconductor wafer is diced to form semiconductor chips, followed by flip-chip mounting. In the flip-chip mounting, the semiconductor chip, after mounting on the wiring board, is let go through a nitrogen reflow furnace set at 250° C. to melt the bump 10 consisting of the low-melting metal. Thus, the semiconductor chip and the wiring board are electrically connected to form a semiconductor device. For the connecting pad, one kind selected from Cu, Ni, Au and Pd films and films of laminate or mixtures thereof, or laminate films in which a film of low-melting metal such as Sn, Ag, Bi, Zn, In, Sb, Cu or Ge and a film of mixtures thereof is formed on a conductive metal can be used. In the surroundings of the semiconductor chip mounted on the wiring board, and between the wiring board and the semiconductor chip, sealing resins such as silicone resin, epoxy resin or acrylic resin can be filled to cure. Further, thus obtained semiconductor device is connected to the motherboard through a connecting terminal of the wiring board.

In the present embodiment, between the barrier metal layer and the bump 10 consisting of the low-melting metal the layer of the intermetallic compound $Ag_3Sn$ is formed. As a result of this, the barrier metal layer and the bump are adhered well. The layer of the intermetallic compound $Ag_3Sn$ suppresses Sn contained in the low-melting metal diffusing into the barrier metal layer (Ni layer). Accordingly, the barrier metal layer is prevented from deteriorating, to result in an improvement of reliability. The intermetallic compound $Ag_3Sn$, not growing coarse even after the high temperature protracted test and thermal cycle test, does not deteriorate due to the temperatures. Furthermore, since the layer 7 of the intermetallic compound $Ag_3Sn$ is formed by sputtering, the thickness thereof can be easily regulated. Still further, since the low-melting metal layer 9 is formed by screen-printing method, steps of-formation thereof can be simplified.

As obvious from the above explanation, according to the present invention, between the barrier metal layer and the protruded electrode consisting of low-melting metal, an intermetallic compound $Ag_3Sn$ which is excellent in adherence to both the barrier metal layer and the protruded electrode, is formed. Accordingly, a semiconductor element of high reliability can be obtained.

What is claimed is:

1. A semiconductor element, comprising:
a semiconductor substrate, a wiring pad formed on the semiconductor substrate, a passivation film with an opening at a center portion of the wiring pad formed on the semiconductor substrate, a layer of barrier metal formed on the wiring pad, an intermetallic compound $Ag_3Sn$ formed on the layer of barrier metal, and a protruded electrode consisting of low-melting metal formed on the intermetallic compound $Ag_3Sn$.

2. The semiconductor element as set forth in claim 1:
wherein the intermetallic compound $Ag_3Sn$ is formed in a layer.

3. The semiconductor element as set forth in claim 1:
wherein the intermetallic compound $Ag_3Sn$ is segregated in particles.

4. The semiconductor element as set forth in claim 1:
wherein the layer of barrier metal is selected from single layers and laminate layers of titanium (Ti), chromium (Cr), copper (Cu), nickel (Ni), palladium (Pd), gold (Au), tungsten (W), titanium nitride (TiN), tantalum (Ta), niobium (Nb) and tantalum nitride (TaN), mixtures thereof and compounds thereof.

5. The semiconductor element as set forth in claim 1:
wherein the layer of barrier metal is a laminate layer in which films of titanium (Ti), nickel (Ni) and palladium (Pd) are stacked in this order.

6. The semiconductor element as set forth in claim 1:

wherein the low-melting metal is selected from tin (Sn), silver (Ag), bismuth (Bi), zinc (Zn), indium (In), antimony (Sb), copper (Cu), germanium (Ge), mixtures thereof and compounds thereof.

7. The semiconductor element as set forth in claim 6:

wherein the low-melting metal is eutectic alloy of Sn and Ag.

8. A fabricating method of a semiconductor element, comprising:

forming a wiring pad on a semiconductor substrate;

forming a layer of barrier metal on the wiring pad;

forming a layer of an intermetallic compound $Ag_3Sn$ on the layer of barrier metal by sputtering; and forming, on the layer of the intermetallic compound $Ag_3Sn$, a protruded electrode consisting of low-melting metal.

9. The fabricating method of the semiconductor element as set forth in claim 8:

wherein forming the layer of barrier metal includes stacking films of titanium (Ti), nickel (Ni) and palladium (Pd) in this order.

10. The fabricating method of the semiconductor element as set forth in claim 8:

wherein the low-melting metal is selected from tin (Sn), silver (Ag), bismuth (Bi), zinc (Zn), indium (In), antimony (Sb), copper (Cu), germanium (Ge), mixtures thereof and compounds thereof.

11. The fabricating method of the semiconductor element as set forth in claim 8:

wherein the low-melting metal is eutectic alloy of Sn and Ag.

12. A fabricating method of a semiconductor element, comprising:

forming a wiring pad on a semiconductor substrate;

forming a passivation film with an opening at a center portion of the wiring pad on the semiconductor substrate;

forming a layer of barrier metal on the wiring pad;

forming a metallic layer containing silver (Ag) on the layer of barrier metal;

forming a layer of low-melting metal containing tin (Sn) on the metallic layer containing Ag; and melting the layer of low-melting metal containing Sn to form a protruded electrode, thereby forming an intermetallic compound $Ag_3Sn$ in the neighborhood of an interface of the metallic layer containing Ag and the layer of low-melting metal containing Sn.

13. The fabricating method of the semiconductor element as set forth in claim 12:

wherein the intermetallic compound $Ag_3Sn$ is formed in a layer.

14. The fabricating method of the semiconductor element as set forth in claim 12:

wherein the intermetallic compound $Ag_3Sn$ is segregated in particles.

15. The fabricating method of the semiconductor element as set forth in claim 12:

wherein the layer of barrier metal is selected from single layers and laminate layers of titanium (Ti), chromium (Cr), copper (Cu), nickel (Ni), palladium (Pd), gold (Au), tungsten (W), titanium nitride (TiN), tantalum (Ta), niobium (Nb) and tantalum nitride (TaN), mixtures thereof and compounds thereof.

16. The fabricating method of the semiconductor element as set forth in claim 12:

wherein forming the layer of barrier metal includes stacking films of titanium (Ti), nickel (Ni) and palladium (Pd) in this order.

17. The fabricating method of the semiconductor element as set forth in claim 12:

wherein the low-melting metal containing Sn is selected from simple Sn and mixtures of Sn and one or more kinds of metals selected from silver (Ag), bismuth (Bi), zinc (Zn), indium (In), antimony (Sb), copper (Cu) and germanium (Ge).

18. The fabricating method of semiconductor elements as set forth in claim 12:

wherein the low-melting metal containing Sn is eutectic alloy of Sn and Ag.

19. The fabricating method of semiconductor elements as set forth in claim 12:

wherein forming the layer of low-melting metal containing Sn includes printing paste containing the low-melting metal.

20. A semiconductor device, comprising:

a semiconductor element including a semiconductor substrate, a wiring pad formed on the semiconductor substrate, a passivation film with an opening at a center portion of the wiring pad formed on the semiconductor substrate, a layer of barrier metal formed on the wiring pad, an intermetallic compound $Ag_3Sn$ formed on the layer of barrier metal, and a protruded electrode consisting of low-melting metal formed on the intermetallic compound $Ag_3Sn$; and a wiring substrate having a first face and a second face, the first face having a connecting pad, wherein the semiconductor element is mounted with a face down on the first face of the wiring substrate, and the protruded electrode of the semiconductor element is connected to the connecting pad of the wiring substrate.

21. The semiconductor device as set forth in claim 20, wherein the connecting pad of the wiring substrate comprises a single layer and a laminate layer selected from metals of Sn, Ag, Bi, Zn, In, Sb, Cu, Ge, Ni, Pd and Au, mixtures thereof, and compounds thereof.

22. The semiconductor device as set forth in claim 20, wherein the intermetallic compound $Ag_3Sn$ is formed in a layer.

23. The semiconductor device as set forth in claim 20, wherein the intermetallic compound $Ag_3Sn$ is segregated in particles.

24. The semiconductor device as set forth in claim 20, wherein the layer of barrier metal is selected from single layers and laminate layers of titanium (Ti), chromium (Cr), copper (Cu), nickel (Ni), palladium (Pd), gold (Au), tungsten (W), titanium nitride (TiN), tantalum (Ta), niobium (Nb), and tantalum nitride (TaN); mixtures thereof; and compounds thereof.

25. The semiconductor device as set forth in claim 20, wherein the layer of barrier metal is a laminate layer in which films of titanium (Ti), nickel (Ni), and palladium (Pd) are stacked in this order.

26. The semiconductor device as set forth in claim 20, wherein the low-melting metal is selected from tin (Sn), silver (Ag), bismuth (Bi), zinc (Zn), indium (In), antimony (Sb), copper (CU), germanium (Ge), mixtures thereof, and compounds thereof.

27. The semiconductor device as set forth in claim 26, wherein the low-melting metal is eutectic alloy of Sn and Ag.

28. A manufacturing method of a semiconductor device, comprising:

forming a semiconductor element, including:
forming a wiring pad on a semiconductor substrate;
forming a layer of barrier metal on the wiring pad;
forming a layer of an intermetallic compound $Ag_3Sn$ on the layer of barrier metal by sputtering; and
forming a protruded electrode consisting of low-melting metal on the layer of the intermetallic compound $Ag_3Sn$;

preparing a wiring substrate having a connecting pad on a main face thereof;
mounting the semiconductor element with a face down on the main face of the wiring substrate; and
connecting the protruded electrode of the semiconductor element to the connecting pad of the wiring substrate.

29. The manufacturing method of a semiconductor device as set forth in claim 28, further comprising forming a sealing resin layer between the wiring substrate and the semiconductor element.

30. A manufacturing method of a semiconductor device, comprising:

fabricating a semiconductor element, including:
forming a wiring pad on a semiconductor substrate;
forming a passivation film with an opening at a center portion of the wiring pad on the semiconductor substrate;
forming a layer of barrier metal on the wiring pad;
forming a metallic layer containing silver (Ag) on the layer of barrier metal;
forming a layer of low-melting metal containing tin (Sn) on the metallic layer containing Ag;
melting the layer of low-melting metal containing Sn to form a protruded electrode, thereby forming an intermetallic compound $Ag_3Sn$ in the neighborhood of an interface of the metallic layer containing Ag and the layer of low-melting metal containing Sn;

preparing a wiring substrate having a connecting pad on a main face thereof;
mounting the semiconductor element with a face down on the main face of the wiring substrate; and
connecting the protruded electrode of the semiconductor element to the connecting pad of the wiring substrate.

31. The manufacturing method of a semiconductor device as set forth in claim 30, further comprising forming a sealing resin layer between the wiring substrate and the semiconductor element.

32. The manufacturing method of a semiconductor device as set forth in claim 30, wherein the intermetallic compound $Ag_3Sn$ is formed in a layer.

33. The manufacturing method of a semiconductor device as set forth in claim 30, wherein the intermetallic compound $Ag_3Sn$ is segregated in particles.

34. The manufacturing method of a semiconductor device as set forth in claim 30, wherein the layer of barrier metal is selected from single layers and laminate layers of titanium (Ti), chromium (Cr), copper (Ca), nickel (Ni), palladium (Pd), gold (Au), tungsten (W), titanium nitride (TiN), tantalum (Ta), niobium (Nb), and tantalum nitride (TaN); mixtures thereof; and compounds thereof.

35. The manufacturing method of a semiconductor device as set forth in claim 30, wherein the layer of barrier metal is a laminate layer in which film of titanium (Ti), nickel (Ni), and palladium (Pd) are stacked in this order.

36. The manufacturing method of a semiconductor device as set forth in claim 30, wherein the low-melting metal is selected from tin (Sn), silver (Ag), bismuth (Bi), zinc (Zn), indium (In), antimony (Sb), copper (Cu), germanium (Ge), mixtures thereof, and compounds thereof.

37. The manufacturing method of a semiconductor device as set forth in claim 30, wherein the low-melting metal is eutectic alloy of Sn and Aq.

38. A semiconductor element, comprising:
a semiconductor substrate;
a wiring pad formed on the semiconductor substrate;
a layer of barrier metal formed on the wiring pad, wherein the layer of barrier metal is selected from single layers and laminate layers of titanium (Ti), chromium (Cr), copper (Cu), nickel (Ni), palladium (Pd), gold (Au), tungsten (W), titanium nitride (TiN), tantalum (Ta), niobium (Nb) and tantalum nitride (TaN); mixtures thereof; and
compounds thereof;
an intermetallic compound $Ag_3Sn$ formed on the layer of barrier metal by sputtering; and
a protruded electrode consisting of low-melting metal formed on the intermetallic compound $Ag_3Sn$.

39. A semiconductor element, comprising:
a semiconductor substrate;
a wiring pad formed on the semiconductor substrate;
a layer of barrier metal formed on the wiring pad, wherein the layer of barrier metal is a laminate layer in which films of titanium (Ti), nickel (Ni), and palladium (Pd) are stacked in this order;
an intermetallic compound $Ag_3Sn$ formed on the layer of barrier metal by sputtering; and
a protruded electrode consisting of low-melting metal formed on the intermetallic compound $Ag_3Sn$.

40. A semiconductor element, comprising:
a semiconductor substrate;
a wiring pad formed on the semiconductor substrate;
a layer of barrier metal formed on the wiring pad, wherein the layer of barrier metal is selected from single layers and laminate layers of titanium (Ti), chromium (Cr), copper (Cu), nickel (Ni), palladium (Pd), gold (Au), tungsten (W), titanium nitride (TiN), tantalum (Ta), niobium (Nb) and tantalum nitride (TaN); mixtures thereof; and compounds thereof;
an intermetallic compound $Ag_3Sn$ formed on the layer of barrier metal by electron beam evaporation; and
a protruded electrode consisting of low-melting metal formed on the intermetallic compound $Ag_3Sn$.

41. A semiconductor element, comprising:
a semiconductor substrate;
a wiring pad formed on the semiconductor substrate;
a layer of barrier metal formed on the wiring pad, wherein the layer of barrier metal is a laminate layer in which films of titanium (Ti), nickel (Ni), and palladium (Pd) are stacked in this order;
an intermetallic compound $Ag_3Sn$ formed on the layer of barrier metal by electron beam evaporation; and
a protruded electrode consisting of low-melting metal formed on the intermetallic compound $Ag_3Sn$.

42. A fabricating method of a semiconductor element, comprising:
forming a wiring pad on a semiconductor substrate;
forming a layer of barrier metal on the wiring pad;
forming a layer of an intermetallic compound $Ag_3Sn$ on the layer of barrier metal by electron beam evaporation; and forming, on the layer of the intermetallic compound Ag$_3$Sn, a protruded electrode consisting of low-melting metal.

43. The fabricating method of the semiconductor element as set forth in claim 42, wherein forming the layer of barrier metal includes stacking films of titanium (Ti), nickel (Ni) and palladium (Pd) in this order.

44. The fabricating method of the semiconductor element as set forth in claim 42, wherein the low-melting metal is selected from tin (Sn), silver (Ag), bismuth (Bi), zinc (Zn), indium (In), antimony (Sb), copper (Cu), germanium (Ge), mixtures thereof, and compounds thereof.

45. The fabricating method of the semiconductor element as set forth in claim 42, wherein the low-melting metal is eutectic alloy of Sn and Aq.

46. A manufacturing method of a semiconductor device, comprising:

fabricating a semiconductor element, including:

forming a wiring pad on a semiconductor substrate;

forming a layer of barrier metal on the wiring pad;

forming a layer of an intermetallic compound Ag$_3$Sn on the layer of barrier metal by electron beam evaporation; and forming a protruded electrode consisting of low melting metal on the layer of the intermetallic compound Ag$_3$Sn;

preparing a wiring substrate having a connecting pad on a main face thereof;

mounting the semiconductor element with a face down on the main face of the wiring substrate; and connecting the protruded electrode of the semiconductor element to the connecting pad of the wiring substrate.

* * * * *

UNITED STATES PATENT AND TRADEMARK OFFICE
CERTIFICATE OF CORRECTION

PATENT NO. : 6,569,752 B1
DATED : May 27, 2003
INVENTOR(S) : Homma et al.

It is certified that error appears in the above-identified patent and that said Letters Patent is hereby corrected as shown below:

Column 14,
Line 63, change "copper (CU)," to -- copper (Cu), --.

Column 15,
Line 58, change "copper (Ca)," to -- copper (Cu), --.

Signed and Sealed this

Twelfth Day of August, 2003

JAMES E. ROGAN
*Director of the United States Patent and Trademark Office*

UNITED STATES PATENT AND TRADEMARK OFFICE
CERTIFICATE OF CORRECTION

PATENT NO. : 6,569,752 B1
DATED : May 27, 2003
INVENTOR(S) : Homma et al.

It is certified that error appears in the above-identified patent and that said Letters Patent is hereby corrected as shown below:

<u>Title page,</u>
Item [73], Assignee, after "(JP)" insert -- and Ebara Corporation, Tokyo, Japan --

Signed and Sealed this

Sixteenth Day of September, 2003

JAMES E. ROGAN
*Director of the United States Patent and Trademark Office*